United States Patent
Ullmann et al.

(10) Patent No.: US 8,922,411 B2
(45) Date of Patent: Dec. 30, 2014

(54) CONFIGURABLE HARDWARE-SHARING MULTI-CHANNEL ADC

(75) Inventors: Igor Ullmann, Villach (AT); Christoph Schneebacher, Villach (AT)

(73) Assignee: Infineon Technologies AG, Neubiberg (DE)

(*) Notice: Subject to any disclaimer, the term of this patent is extended or adjusted under 35 U.S.C. 154(b) by 0 days.

(21) Appl. No.: 13/429,578

(22) Filed: Mar. 26, 2012

(65) Prior Publication Data

US 2013/0249725 A1  Sep. 26, 2013

(51) Int. Cl.
H03M 1/00 (2006.01)
H03M 3/02 (2006.01)
H03M 1/16 (2006.01)

(52) U.S. Cl.
CPC .............. H03M 1/004 (2013.01); *H03M 1/164* (2013.01)
USPC .............................. 341/143; 341/120; 341/155

(58) Field of Classification Search
USPC ......................................... 341/141, 143, 155
See application file for complete search history.

(56) References Cited

U.S. PATENT DOCUMENTS

| | | | |
|---|---|---|---|
| 6,765,517 B1* | 7/2004 | Ali | 341/143 |
| 6,894,632 B1* | 5/2005 | Robinson | 341/143 |
| 2004/0036640 A1* | 2/2004 | Kawamura | 341/143 |
| 2008/0055127 A1* | 3/2008 | Kim et al. | 341/118 |
| 2009/0128384 A1* | 5/2009 | Di Giandomenico et al. | 341/143 |
| 2011/0063155 A1* | 3/2011 | Chen et al. | 341/143 |

* cited by examiner

*Primary Examiner* — Howard Williams
(74) *Attorney, Agent, or Firm* — SpryIP, LLC

(57) ABSTRACT

Representative implementations of devices and techniques provide configurable multi-channel analog-to-digital conversion. In a multi-channel analog-to-digital converter (ADC), one or more ADC stages may be operatively coupled to a different ADC in each of various operating modes.

24 Claims, 4 Drawing Sheets

FIRST OPERATING MODE

SECOND OPERATING MODE

CONFIGURABLE HARDWARE-SHARING MULTI-CHANNEL ADC

BACKGROUND

Various types of systems may use an analog-to-digital converter (ADC) to convert an analog signal originating from a sensor, for example, to a digital signal that can be processed by a computer, a processor, a microcontroller, or the like. Some types of ADCs convert analog signals to digital signals using multiple stages. Multiple stages may provide a resolution and/or signal-to-noise ratio to match the type of analog signal being converted. For example, an ADC with one or a few stages may be used to convert a signal with a lower resolution or low signal-to-noise specifications. Alternately, an ADC with more stages may be used to convert a signal with a higher resolution and/or higher signal-to-noise specifications.

Many modern systems, such as those for industrial, aerospace, and automotive applications, and the like, have multiple sensors, for example, providing many analog signals to be processed, often at the same time. Multi-channel ADC arrangements (e.g., devices, systems, circuits, etc.) may be used to convert several analog signals concurrently. Multi-channel ADC arrangements generally have two or more channels operating in parallel, each including an ADC.

However, due to manufacturing constraints, multi-channel ADC arrangements have commonly been designed to deliver a fixed performance per channel across each of the channels. In other words, each channel of the multi-channel ADC arrangement may be designed alike and has the same resolution and/or signal-to-noise capabilities (i.e., may have the same number of ADC stages in each channel). Thus, for a given application, a multi-channel ADC arrangement may be selected that has a performance high enough to meet the processing needs of the highest quality input signal. This may be overkill and a waste of hardware-efficiency, power, and the like, for other channels on the multi-channel ADC arrangement that are used for converting lower resolution signals. Further, custom multi-channel ADC arrangements may be better suited to a variety of multiple input signals, but can be costly if tailored for specific applications.

BRIEF DESCRIPTION OF THE DRAWINGS

The detailed description is set forth with reference to the accompanying figures. In the figures, the left-most digit(s) of a reference number identifies the figure in which the reference number first appears. The use of the same reference numbers in different figures indicates similar or identical items.

For this discussion, the devices and systems illustrated in the figures are shown as having a multiplicity of components. Various implementations of devices and/or systems, as described herein, may include fewer components and remain within the scope of the disclosure. Alternately, other implementations of devices and/or systems may include additional components, or various combinations of the described components, and remain within the scope of the disclosure.

DETAILED DESCRIPTION

Overview

Representative implementations of devices and techniques provide configurable multi-channel analog-to-digital conversion. In a multi-channel analog-to-digital converter (ADC) arrangement, each channel of the multi-channel ADC arrangement includes a configurable ADC made up of multiple stages. One or more of the ADC stages may be operatively coupled to a different ADC (i.e., hardware sharing) in each of various operating modes. For example, a single ADC stage may be an element of a first ADC channel in one operational mode and may be an element of a second ADC channel in another operational mode. Hardware sharing between the ADCs provides a flexible ADC arrangement that reduces hardware or power waste in multi-channel applications. A flexible architecture also allows individual channels to be adjusted to more closely meet the specifications of individual input signals.

In various alternate implementations, multiple ADC stages are either partly or fully integrated with a hardware component. The ADC stages may be arranged in one or more configurations, often using the same amount of area, to form one or more multi-stage ADC arrangements. For example, the same matrix of ADC stages may be arranged in a first configuration to form three ADC channels or in a second configuration to form two ADC channels, where the two ADC channels have a greater quantity of stages per ADC channel, and have a higher resolution or a greater signal-to-noise ratio. Accordingly, the same chip design may be mass produced to meet the needs of a variety of applications with differing performance specifications.

Implementations are explained in more detail below using a plurality of examples. Although various implementations and examples are discussed here and below, further implementations and examples may be possible by combining the features and elements of individual implementations and examples.

Example Multi-Channel, Multi-Stage ADC Arrangement

Figure 1:
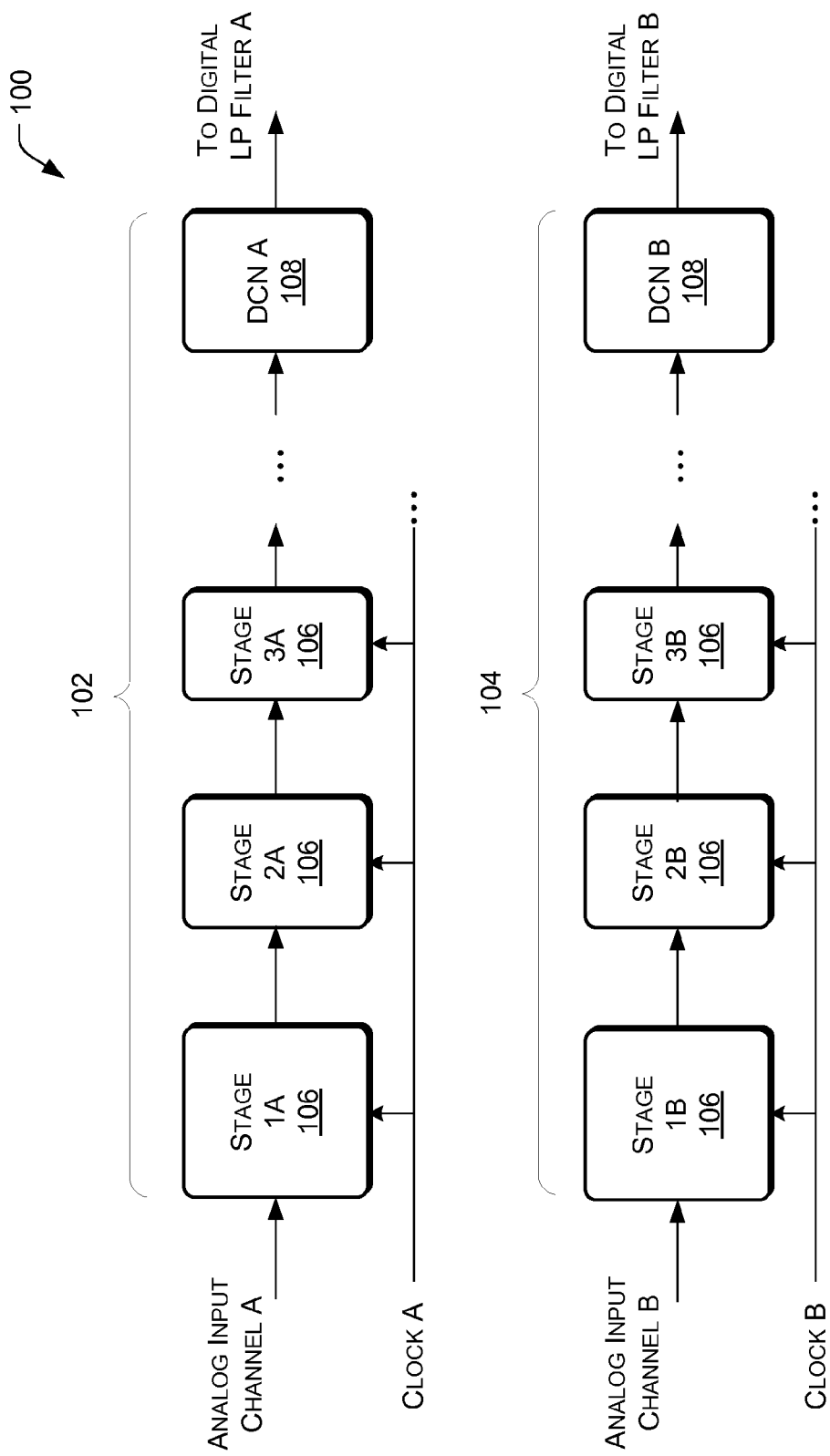
FIG. 1 is a schematic drawing of an example multi-channel, multi-stage analog-to-digital converter (ADC) arrangement in a first operating mode, according to an implementation.

FIG. 1 is a schematic drawing of an example multi-channel, multi-stage analog-to-digital converter (ADC) arrangement 100 in a first operational mode, according to an implementation. It is to be understood that multi-channel ADC arrangements (such as ADC arrangement 100) may be implemented as stand-alone circuits, apparatuses, or devices, or as part of another system (e.g., integrated with other components, processors, etc.). The illustrated multi-channel ADC arrangement 100 in FIG. 1 is shown and described in terms of a "sigma-delta" ADC arrangement, which may have noise shaping or noise reducing properties. This illustration is, however, for ease of discussion. The techniques and devices described herein with respect to multi-channel ADC arrangements is not limited to the circuit diagram illustrated in FIG. 1 or to a sigma-delta device, and may be applied to other types of ADC arrangements (e.g., direct-conversion, successive-approximation, ramp-compare, subranging, etc.), or other ADC designs without departing from the scope of the disclosure. In some cases, additional or alternative components may be used to implement the techniques described herein.

As shown in FIG. 1, in a first operational mode, a multi-channel ADC arrangement 100 includes at least two analog-to-digital converters (ADCs) 102 and 104. In some implementations, a multi-channel ADC arrangement 100 includes a greater number of ADCs. Each ADC (102 and 104) comprises multiple stages 106. The ADC arrangement 100 illustrated in FIG. 1 shows a 2× 1-1-1 arrangement, meaning 2 ADCs (102 and 104), with each having a cascade of three stages 106 (i.e., 1A, 2A, 3A and 1B, 2B, 3B).

In an implementation, the quantity of stages 106 in an ADC (102, 104) determines a resolution of the ADC, a signal-to-noise ratio (SNR) of the ADC, a signal-to-noise plus distortion ratio (SNDR) of the ADC, a bandwidth of the ADC, and the like. For example, an ADC (102, 104) with two stages 106 may be a second-order ADC, an ADC (102, 104) with three stages 106 may be a third-order ADC, and the like. In an implementation, the greater the quantity of stages 106 in the ADC (102, 104), the greater the resolution, SNR, SNDR, bandwidth, noise reduction, and so forth.

In various implementations, stages 106 may be arranged to form multiple ADCs (102, 104). In an implementation, one or more of the ADCs (102 and 104) are arranged as a multi-stage noise shaping (MASH) ADC. For example, each stage 106 of the MASH ADC (102, 104) reduces the noise of the signal it receives from the output of the stage 106 before it. In various implementations, one or more of the stages 106 of the ADCs (102, 104) are sigma-delta devices. In other implementations, the stages 106 are other technology stage devices according to other arrangements.

In one implementation, the sigma-delta stages 106 are arranged to provide multiple ADCs in channels on a single integrated circuit (IC). In alternate implementations, the sigma-delta stages 106 are arranged on multiple ICs or components.

The illustrated ADCs (102, 104) in FIG. 1 are shown with three stages 106 each for ease of discussion. An example ADC (102, 104) may have any number of stages 106 and remain within the scope of the disclosure. In an alternate implementation, an ADC 102 may have a different quantity of stages 106 than an ADC 104. As shown in FIG. 1, a clock signal (clock A and B) is provided to each of the stages 106 in an ADC (102, 104) for timing purposes.

Additionally, as shown in FIG. 1, an ADC (102, 104) may include a digital correction network (DCN) 108. The DCN 108 may be coupled at the output end of the stages 106, to prepare the resulting signal for digital filtering and processing. Also as shown in FIG. 1, the output of the ADC (102, 104) may be filtered by a digital filter (e.g., a decimation filter), "LP Filter A and B," respectively. For example, each ADC (102, 104) may have a DCN 108 and a digital filter associated with the ADC. In an alternate implementation, a single filter may be associated with multiple ADCs (102, 104), using multiplexing. Further, a DCN 108 may be partially or fully shared by two or more ADCs, as will be discussed further.

In an implementation, as shown in FIG. 1, the ADC 102 is included in a first channel, "Channel A," and the ADC 104 is included in a second channel, "Channel B." In various implementations, a multi-channel ADC arrangement 100 may have any number of channels, each including an ADC (102, 104). In one implementation, the channels (A, B) of an ADC arrangement 100 are non-time-interleaved channels operating in parallel. For example, the channels (A, B) operate nearly simultaneously or concurrently, rather than taking turns in a cycle.

In various implementations, the multi-stage ADC arrangement 100 is implemented at least in part in hardware. For example, the ADC arrangement 100 may be implemented at least in part using accumulators, adders, flip-flops, and the like.

Example Hardware Sharing

Figure 2:
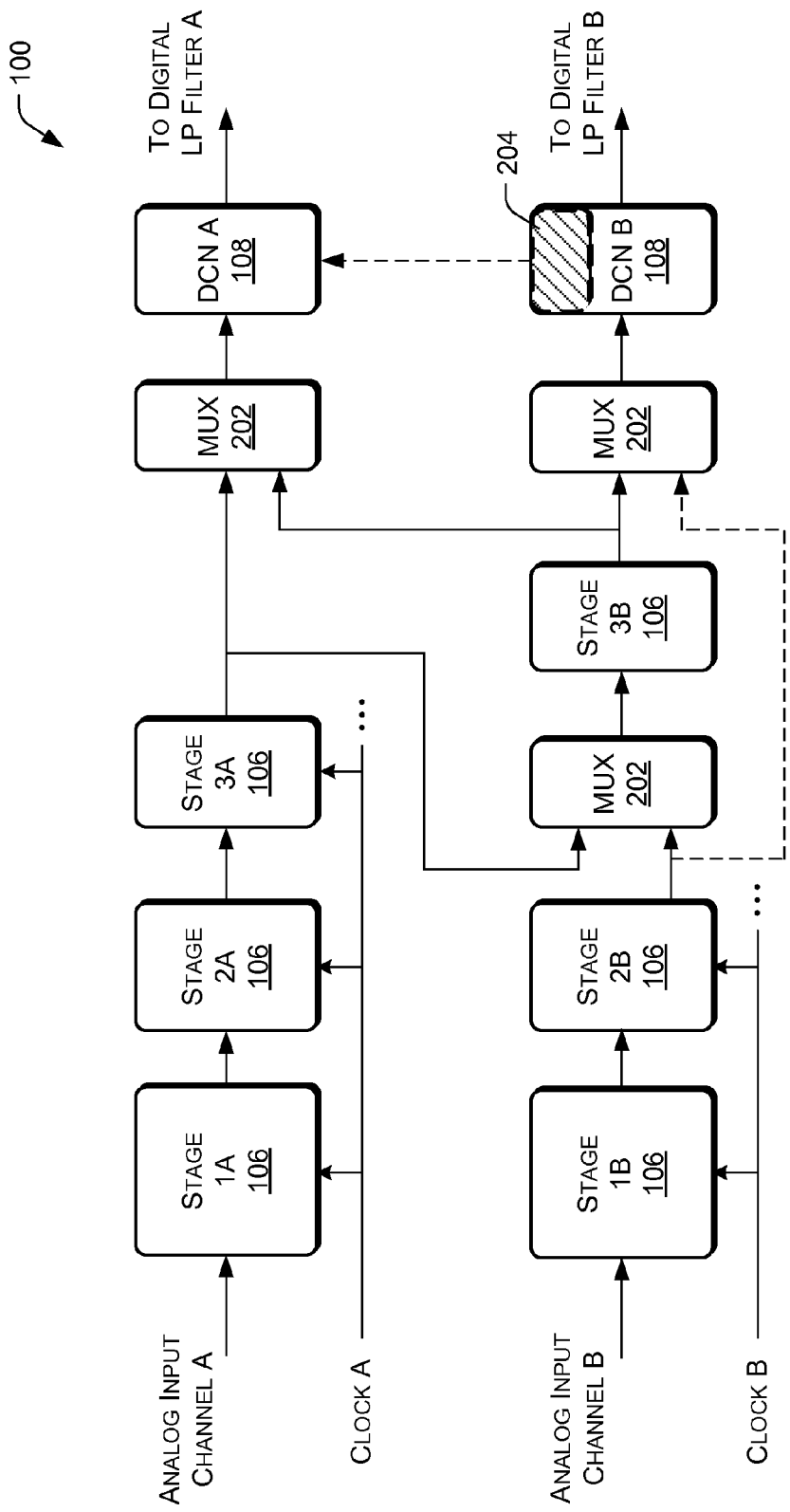
FIG. 2 is a schematic drawing of the example multi-channel, multi-stage analog-to-digital converter (ADC) arrangement in a second operating mode, illustrating hardware sharing, according to an implementation.

FIG. 2 is a schematic drawing of the example multi-channel, multi-stage analog-to-digital converter (ADC) arrangement 100 in a second operational mode, illustrating hardware sharing, according to one implementation. In FIG. 2, the labels for ADC 102 and ADC 104 are not shown for clarity. However, in FIG. 2, as shown in FIG. 1, ADC 102 includes the ADC components associated with channel A (the "A" labeled components) and ADC 104 includes the ADC components associated with channel B (the "B" labeled components).

Generally, hardware sharing includes adjusting an ADC arrangement 100 such that components of one ADC or channel are used or shared by another ADC or channel. For example, hardware sharing includes adjusting ADC arrangement 100 such that ADC 102 uses or shares components from (or associated with) ADC 104 and channel B; and/or ADC 104 uses or shares components from (or associated with) ADC 102 and channel A. In various implementations, an ADC (102, 104) or ADC channel (A, B) can be operatively coupled to, and use a component from (or associated with) another ADC or channel in addition to its own components or instead of its own components while in a hardware sharing operational mode.

Referring to FIGS. 1 and 2, in an implementation, one or more of the B1, B2, or B3 stages 106 associated with ADC 104 and channel B are configurable to be operatively coupled to ADC 104 and channel B while the ADC arrangement 100 is in a first operational mode (as shown in FIG. 1) and operatively coupled to ADC 102 and channel A while the ADC arrangement 100 is in a second operational mode.

The first operational mode is shown in FIG. 1, where stage 3B, for example, is operatively coupled to ADC 104 and channel B. The second operational mode is shown in FIG. 2, where stage 3B, for example, is operatively coupled to ADC 102 and channel A. While the ADC arrangement 100 is a 2× 1-1-1 arrangement in the first operational mode, the ADC arrangement 100 is a 1× 1-1-1-1 (1A, 2A, 3A, 3B) plus 1× 1-1 (1B, 2B) arrangement in the second operational mode.

In the second operational mode, the ADC 102 is a fourth-order ADC with the addition of stage 3B, since stage 3B becomes a fourth stage in the signal path of channel A. Thus, in various implementations, channel A is able to provide a higher resolution, a greater bandwidth, a greater SNR or SNDR, and the like, to an input signal applied to channel A, while in the second operational mode. Consequently, in the second operational mode, ADC 104 becomes a second-order ADC without stage 3B, and channel B has a lower resolution, SNR, etc. than channel A, or than while in the first operational mode.

In one implementation, as shown with the dashed line in FIG. 2, the stage 3B may be bypassed by channel B in the second operational mode. For example, while stage 3B is "working for" channel A in the second operational mode, the signal path of channel B may bypass stage 3B. Conversely, while stage 3B is "working for" channel B in the first operational mode, the signal path of channel B includes stage 3B.

In an implementation, the ADC arrangement 100 may include a number of multiplexors (MUX) 202. The MUXs 202 may facilitate the hardware sharing between ADC channels, at least while in the second operational mode. For example, as illustrated in FIG. 2, there is a MUX 202 in the channel B signal path just prior to stage 3B. This MUX 202 provides multiplexing of the channel A signal and the channel B signal through the stage 3B, allowing channel A and ADC 102 to share stage 3B. In some implementations, the ADC arrangement 100 may be adjusted such that ADC 102 (and channel A) and ADC 104 (and channel B) alternately share stage 3B, for example. Stage 3B may be alternately operatively coupled to ADC 102 (and channel A) in the second operational mode and operatively coupled to ADC 104 (and channel B) in the first operational mode. In an implementation, being operatively coupled includes "turning on" the signal path, and the like, such that a signal passes through the operatively coupled component(s).

In an implementation, as shown in FIG. 2, each of the ADCs 102 and 104 have a MUX 202 added to the respective signal paths, just prior to the DCNs 108. A MUX 202 just prior to the DCN A 108 of channel A allows signals from stages 3A and 3B to be multiplexed to DCN A 108 during the first and second operational modes respectively. The signal from stage 3B is used during the second operational mode, while stage 3B is being used by ADC 102 (channel A). A MUX 202 just prior to the DCN B 108 of channel B allows signals from stages 2B and 3B to be multiplexed to DCN B 108 during the second and first operational modes respectively. The signal from stage 3B is used during the first operational mode, while stage 3B is being used by ADC 104 (channel B). The signal from stage 2B is used during the second operational mode, while stage 3B is being used by ADC 102 (channel A).

In an implementation, while the ADC arrangement 100 is in the second operational mode, DCN B is partitioned such that a portion of DCN B that is associated with stage 3B, for example, (i.e., the shared component(s)) is multiplexed to DCN A. In FIG. 2, the partitioned portion of DCN B that is associated with stage 3B is represented by the shaded area 204. The partitioned area 204 is multiplexed to DCN A for digital processing at channel A during the second operational mode. This internal multiplexing is represented by the dashed arrow from the partitioned area 204 to DCN A.

In various implementations, controlling or adjusting the ADC arrangement 100 between operational modes may be performed by control logic, microcontroller, firmware, software, and the like. In one implementation, an end user may adjust the ADC arrangement 100 to an operational mode suitable for an application. In another implementation, the end user may adjust the ADC arrangement 100 to determine the arrangement of the multiple ADCs (e.g., 102, 104), including the stages included by each ADC (102, 104) during each operational mode.

In various implementations, signal paths for multiple operational modes and ADC arrangements are available on an ADC arrangement 100. For example, a chip design or component containing an ADC arrangement 100 may include or provide the signal paths for multiple operational modes, including multiple hardware sharing scenarios. Signal paths may include one or more of hardware, firmware, or software paths, and may be implemented in wired, wireless, optical, inductive, magnetic, and/or other transmission technologies.

Example Implementation

Figure 3:
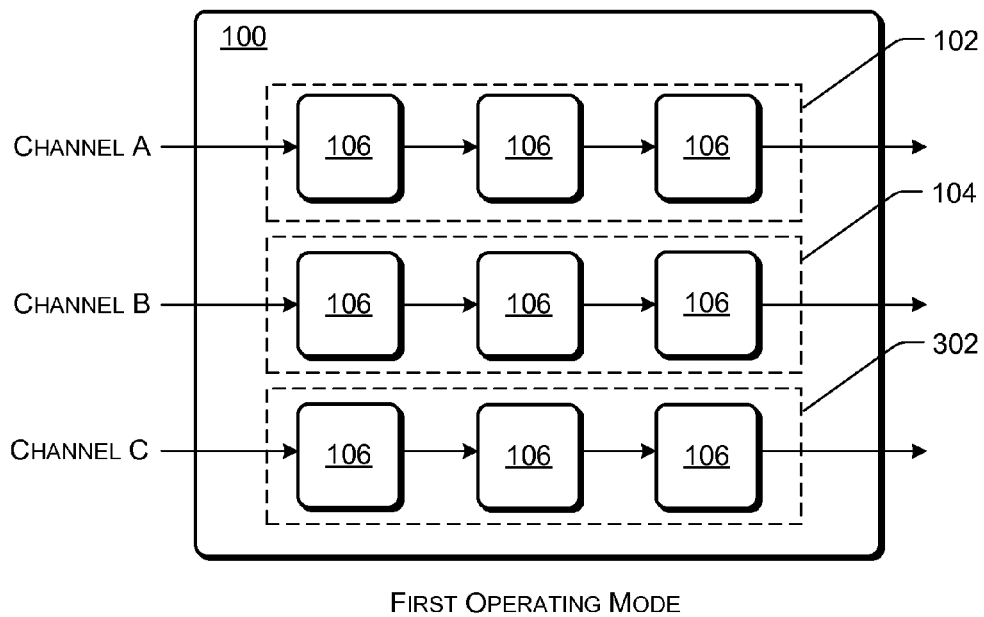
FIG. 3 is schematic diagram of the example multi-channel, multi-stage analog-to-digital converter (ADC) arrangement in a first operating mode and a second operating mode, according to another implementation.
Figure 3:
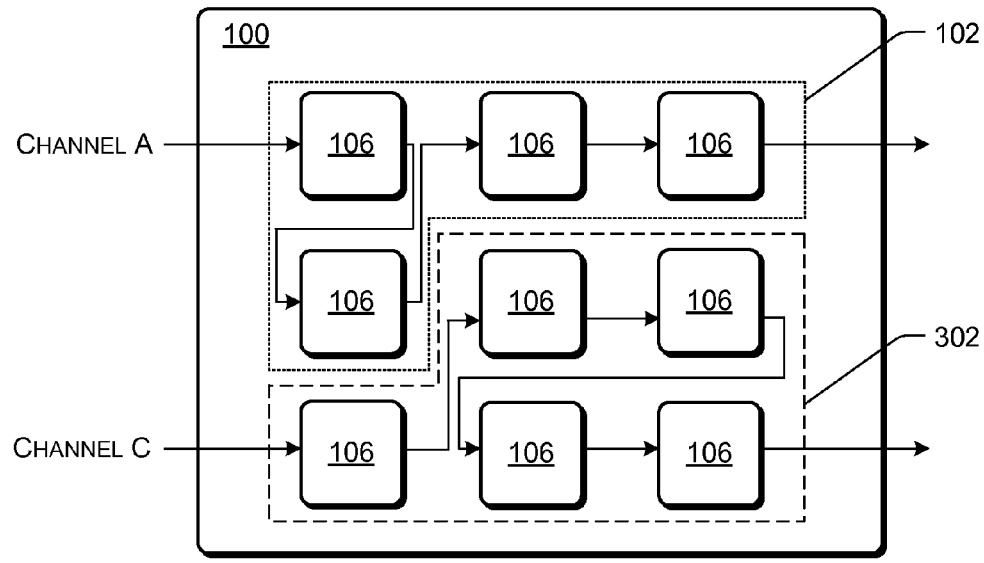

FIG. 3 is schematic diagram of the example multi-channel, multi-stage analog-to-digital converter (ADC) arrangement 100 in a first operating mode and a second operating mode, according to another example implementation. Some components of the ADC arrangement 100 are not shown in FIG. 3 for clarity.

In one implementation, the ADC arrangement 100 is a mass-producible single design that is adjustable to form varying, multiple channels, ADCs, and arrangements. For example, in one instance, the ADC arrangement 100 comprises a matrix of ADC stages with configurable signal paths.

In one implementation, the matrix of ADC stages is arranged into multiple ADCs by configuring the signal paths into a desired arrangement, representing a first operating mode. Further, the matrix of ADC stages is arranged into multiple other ADCs by adjusting the signal paths into a different arrangement, representing a second operating mode.

In an implementation, the ADC arrangement 100 may be alternated between the first and second operating modes. In another implementation, the ADC arrangement 100 may be further adjusted to a third or fourth operating mode, and the like. Accordingly, a hardware device (such as a sigma-delta stage 106, for example) may be applied to work for more than one channel in a single implementation.

The ADC arrangement 100 is shown and described in FIG. 3 as having three ADC channels: ADC 102 at channel A, ADC 104 at channel B, and ADC 302 at channel C. In alternate implementations, the ADC arrangement 100 may have fewer channels or a greater quantity of channels. In an implementation, each of the ADC channels (A, B, C) includes multiple sigma-delta stages 106.

In one implementation, the ADC arrangement 100 is adjustable from a first operating mode to at least a second operating mode. In one example, the ADC arrangement 100 has fewer ADC channels in the second operating mode than in the first operating mode. Further, one or more of the ADC channels (A, B, C) includes a greater quantity of sigma-delta stages 106 in the second operating mode and has a higher resolution in the second operating mode than in the first operating mode.

For example, in the first operating mode, as shown in FIG. 3, each of the ADCs (102, 104, 302) in each of the channels (A, B, C) is shown with three stages 106 (e.g., a 3× 1-1-1 arrangement). However, in the second operating mode, the first stage 106 of ADC 104 (channel B) is operatively coupled to ADC 102 of channel A. With the addition of the stage 106, ADC 102 becomes a fourth-order ADC, having four stages in the second operating mode.

Also in the second operating mode, the second and third stages 106 of ADC 104 (channel B) are operatively coupled to ADC 302 of channel C. With the addition of the stages 106, ADC 302 becomes a fifth-order ADC, having five stages in the second operating mode. As shown in FIG. 3, the ADC arrangement 100 in the second operating mode is 1× 1-1-1-1 plus 1× 1-1-1-1-1.

In this example, the ADC arrangement 100 has fewer ADC channels (two) in the second operating mode than in the first operating mode (three). With the stages 106 of ADC 104 operatively coupled to ADCs 102 and 302, channel B is effectively eliminated during the second operating mode. Further, both of the ADC channels A and C include a greater quantity of sigma-delta stages 106 in the second operating mode than in the first operating mode. Finally, in this example, both of the ADC channels A and C have a higher resolution in the second operating mode than in the first operating mode, based on the additional stages coupled to each of the ADCs (A, C).

As discussed above, the ADC arrangement 100 may use multiplexors (such as MUX 202) or the like to facilitate hardware sharing between the ADCs. Further, If the ADCs use DCNs, one or more of the DCNs may be partitioned (also hardware sharing) as discussed above, for example, to direct a signal to the correct output path (e.g., for digital filtering, processing, etc.) during hardware sharing of a stage 106.

In alternate implementations, the ADCs (102, 104, 302) of ADC arrangement 100 may be coupled in a different manner, with different results. For example, channel B may not be eliminated in an implementation if some of the stages of ADC 104 are not coupled to another ADC in the second operating mode. Further, the manner in which the stages 106 are coupled (order, path, etc.) as illustrated in FIGS. 1-3 is not intended to be limiting, and stages 106 may be coupled in various other manners and remain within the scope of the disclosure.

In various implementations, the ADCs of an ADC arrangement 100 may have fewer or a greater quantity of stages 106, and remain within the scope of the disclosure. Also, additional or alternate components may be included in an ADC arrangement 100.

Representative Process

Figure 4:
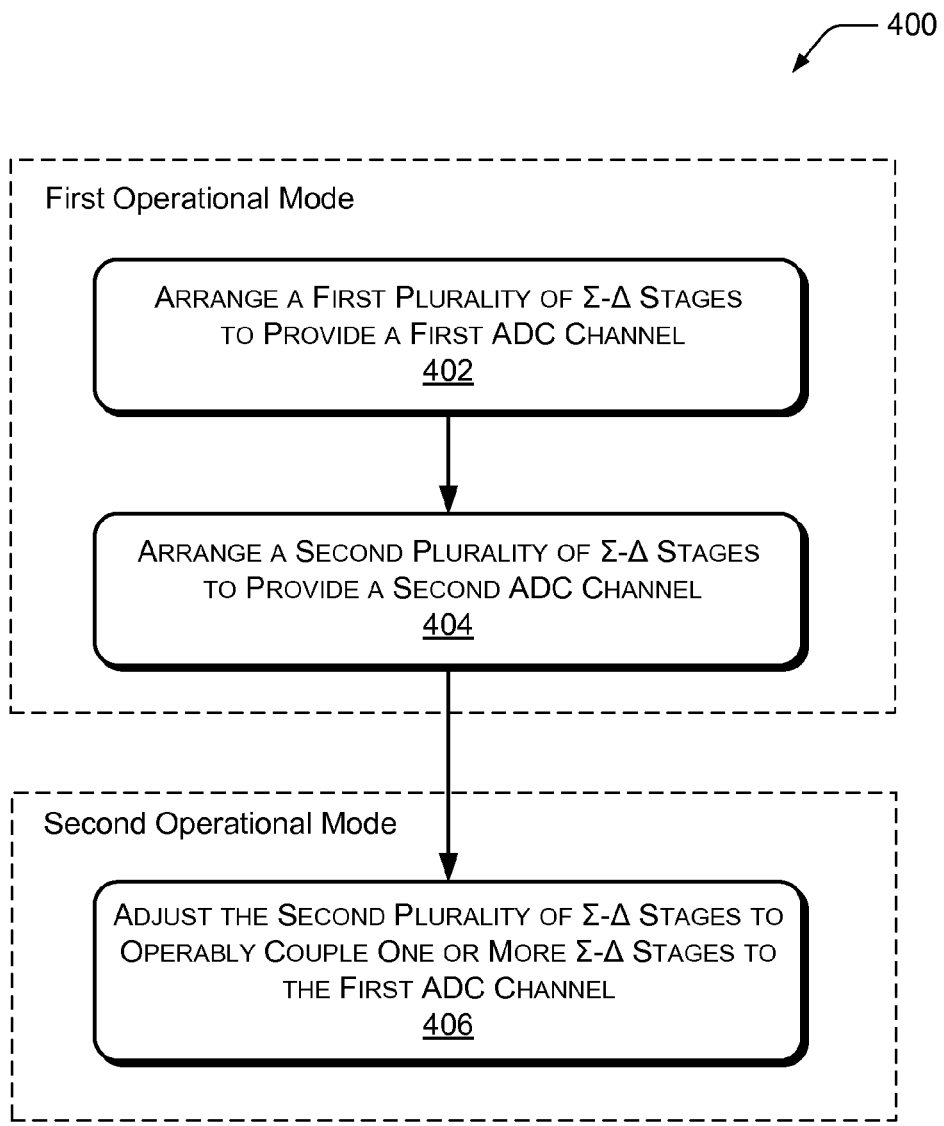
FIG. 4 is a flow diagram illustrating an example process for adjusting a multi-channel ADC arrangement, including sharing ADC stages, according to an implementation.

FIG. 4 illustrates a representative process 400 for adjusting a multi-channel ADC arrangement (such as ADC arrangement 100), according to an implementation. An example process 400 includes sharing ADC stages (such as stages 106) and/or other components between ADCs (such as ADCs 102, 104, and 302). In various implementations, an ADC stage may be operatively coupled to one ADC in a first operational mode and operatively coupled to another ADC in a second operational mode. The process 400 is described with reference to FIGS. 1-3.

The order in which the process is described is not intended to be construed as a limitation, and any number of the described process blocks can be combined in any order to implement the process, or alternate processes. Additionally, individual blocks may be deleted from the process without departing from the spirit and scope of the subject matter described herein. Furthermore, the process can be implemented in any suitable hardware, software, firmware, or a combination thereof, without departing from the scope of the subject matter described herein.

At block 402, the process includes arranging, in a first operational mode, a first plurality of sigma-delta stages to provide a first analog-to-digital converter (ADC) channel.

At block 404, the process includes arranging, in the first operational mode, a second plurality of sigma-delta stages to provide a second ADC channel.

In one implementation, the first and second ADC channels are arranged as multi-stage noise shaping (MASH), non-time-interleaved, sigma-delta ADC channels. In another implementation, the process includes arranging the first and second pluralities of sigma-delta stages to provide the first and second ADC channels on a single integrated circuit (IC).

At block 406, the process includes adjusting, in a second operational mode, the second plurality of sigma-delta stages to operatively couple one or more of the second plurality of sigma-delta stages to the first ADC channel. In one instance, the adjusting includes adjusting a signal path of the first ADC channel to include elements of the second ADC channel.

In one implementation, the process includes adjusting, in the second operational mode, the second ADC channel to bypass the one or more sigma-delta stages.

In an alternate implementation, the process includes adjusting the first and second ADC channels to share the one or more sigma-delta stages. For example, the one or more sigma-delta stages are alternately operatively coupled to the first ADC channel in the second operational mode and operatively coupled to the second ADC channel in the first operational mode.

In one implementation, the process 400 includes multiplexing signals from the first and second ADC channels through the one or more sigma-delta stages.

In another implementation, the process 400 includes partitioning, in the second operational mode, a digital correction network (such as DCN B) coupled to the second ADC channel such that a portion of the second digital correction network associated with the one or more sigma-delta stages is multiplexed to another digital correction network (such as DCN A) coupled to the first ADC channel.

In one implementation, the process 400 includes adjusting, in the second operational mode, the performance of at least one of the first and second ADC channels for at least one of signal-to-noise ratio, signal-to-noise plus distortion ratio, and resolution. For example, adding an additional sigma-delta stage to the signal path of an ADC, through hardware sharing, for example, can improve performance of the ADC. On the other hand, losing a sigma-delta stage from a signal path of an ADC during an operational mode can decrease performance of the ADC.

In one implementation, the performance of the first and second ADC channels is adjusted such that the first ADC channel has a higher resolution in the second operational mode than in the first operational mode, and the second ADC channel has a lower resolution in the second operational mode than in the first operational mode. In one example, operatively coupling a sigma-delta stage associated with the second ADC to the first ADC, in the second operational mode, increases the resolution of the first ADC in the second operational mode compared to the first operational mode. Additionally, operatively coupling the sigma-delta stage associated with the second ADC to the first ADC reduces the resolution of the second ADC in the second operational mode.

In alternate implementations, other techniques may be included in the process 400 in various combinations, and remain within the scope of the disclosure.

Conclusion

Although the implementations of the disclosure have been described in language specific to structural features and/or methodological acts, it is to be understood that the implementations are not necessarily limited to the specific features or acts described. Rather, the specific features and acts are disclosed as representative forms of implementing example devices and techniques.

What is claimed is:

1. An apparatus comprising:
   a first analog-to-digital converter (ADC) comprising a first plurality of stages; and
   a second ADC comprising a second plurality of stages, one or more stages of the second plurality of stages configurable to be operatively coupled to the second ADC while the apparatus is in a first operational mode and operatively coupled to the first ADC while the apparatus is in a second operational mode,
   wherein at least one of the first ADC and the second ADC are multi-stage noise shaping (MASH) ADCs.

2. The apparatus of claim 1, the first ADC and the second ADC further comprising a first multiplexor and a second multiplexor respectively, and further comprising a third multiplexor operatively coupled to the one or more stages and to the first ADC while the apparatus is in the second operational mode.

3. The apparatus of claim 1, further comprising a first channel including the first ADC and a second channel including the second ADC.

4. The apparatus of claim 3, wherein the first and second channels are non-time-interleaved or time-interleaved channels operating in parallel.

5. The apparatus of claim 1, the first ADC and the second ADC further comprising a first digital correction network and a second digital correction network respectively.

6. The apparatus of claim 5, wherein the second digital correction network is partitioned while the apparatus is in the second operational mode, a portion of the second digital correction network associated with the one or more stages being multiplexed to the first digital correction network.

7. The apparatus of claim 1, wherein one or more stages of the first plurality of stages and the second plurality of stages comprise sigma-delta ADC stages.

8. The apparatus of claim 1, wherein the first ADC has a higher resolution than the second ADC while the apparatus is in the second operational mode.

9. A multi-channel system comprising:
a plurality of configurable analog-to-digital converters (ADCs), each ADC including multiple stages; and
a plurality of sigma-delta devices arranged to compose the multiple stages, one of the plurality of sigma-delta devices composing a stage of one of the plurality of ADCs in a first arrangement and composing a stage of another of the plurality of ADCs in another arrangement,
wherein one or more ADCs of the plurality of ADCs comprises a multi-stage noise shaping (MASH) ADC.

10. The system of claim 9, further comprising one or more multiplexors operatively coupled to the one of the plurality of sigma-delta devices in the other arrangement.

11. The system of claim 9, wherein each of the plurality of ADCs comprises a non-time-interleaved or a time-interleaved channel of the multi-channel system.

12. The system of claim 9, wherein the system is implemented at least in part in hardware using at least one of accumulators, adders, and flip-flops.

13. A method comprising:
arranging, in a first operational mode, a first plurality of sigma-delta stages to provide a first analog-to-digital converter (ADC) channel and a second plurality of sigma-delta stages to provide a second ADC channel; and
adjusting, in a second operational mode, the second plurality of sigma-delta stages to operatively couple one or more of the second plurality of sigma-delta stages to the first ADC channel.

14. The method of claim 13, further comprising arranging the first and second ADC channels as multi-stage noise shaping (MASH), non-time-interleaved or a time-interleaved, sigma-delta ADC channels.

15. The method of claim 13, further comprising arranging the first and second pluralities of sigma-delta stages to provide the first and second ADC channels on a single integrated circuit (IC).

16. The method of claim 13, further comprising adjusting, in the second operational mode, the second ADC channel to bypass the one or more sigma-delta stages.

17. The method of claim 13, further comprising adjusting the first and second ADC channels to share the one or more sigma-delta stages, the one or more sigma-delta stages being alternately operatively coupled to the first and second ADC channels in the second and first operational modes, respectively.

18. The method of claim 13, further comprising adjusting, in the second operational mode, a signal path of the first ADC channel to include elements of the second ADC channel.

19. The method of claim 13, further comprising multiplexing signals from the first and second ADC channels through the one or more sigma-delta stages.

20. The method of claim 13, further comprising partitioning, in the second operational mode, a digital correction network coupled to the second ADC channel such that a portion of the second digital correction network associated with the one or more sigma-delta stages is multiplexed to another digital correction network coupled to the first ADC channel.

21. The method of claim 13, further comprising adjusting, in the second operational mode, the performance of at least one of the first and second ADC channels for at least one of signal-to-noise ratio, signal-to-noise plus distortion ratio, or resolution.

22. The method of claim 21, further comprising adjusting the performance of the first and second ADC channels, wherein the first ADC channel has a higher resolution in the second operational mode than in the first operational mode, and the second ADC channel has a lower resolution in the second operational mode than in the first operational mode.

23. A multi-channel analog-to-digital converter (ADC) device comprising:
a plurality of ADC channels, each ADC channel comprising multiple sigma-delta stages,
wherein the device is adjustable from a first operating mode to a second operating mode, the second operating mode having fewer ADC channels than the first operating mode and one or more of the plurality of ADC channels comprising a greater quantity of sigma-delta stages and having a higher resolution in the second operating mode than in the first operating mode.

24. The multi-channel ADC device of claim 23, wherein one or more of the sigma-delta stages is arranged to be operatively coupled to one of the plurality of ADC channels in the second operating mode and is arranged to be operatively coupled to another of the plurality of ADC channels in the first operating mode.

* * * * *